(12) United States Patent
Shaie

(10) Patent No.: US 6,888,724 B2
(45) Date of Patent: May 3, 2005

(54) NETWORK CARD DEVICE HAVING PROTECTIVE STRUCTURE

(76) Inventor: John Shaie, P.O. Box 10-69, Chong Ho, Taipei (TW), 235

( * ) Notice: Subject to any disclaimer, the term of this patent is extended or adjusted under 35 U.S.C. 154(b) by 133 days.

(21) Appl. No.: 10/404,593

(22) Filed: Mar. 29, 2003

(65) Prior Publication Data

US 2004/0190265 A1 Sep. 30, 2004

(51) Int. Cl.$^7$ ................................. G06F 1/16
(52) U.S. Cl. ..................... 361/719; 361/737; 439/160; 235/382; 235/486
(58) Field of Search ................. 361/719, 737, 361/725–727, 752, 796; 439/160, 946, 630, 638, 687, 696, 906, 945; 235/486, 382, 454, 441, 479, 492, 451, 380, 375, 482; 257/679; 343/700 MS, 702, 906

(56) References Cited

U.S. PATENT DOCUMENTS

| | | | | |
|---|---|---|---|---|
| 5,679,007 A | * | 10/1997 | Potdevin et al. | 439/76.1 |
| 5,877,488 A | * | 3/1999 | Klatt et al. | 235/486 |
| 5,993,261 A | * | 11/1999 | Klatt et al. | 439/630 |
| 6,015,092 A | * | 1/2000 | Postlewaite et al. | 235/486 |
| 6,069,795 A | * | 5/2000 | Klatt et al. | 361/737 |
| 6,075,706 A | * | 6/2000 | Learmonth et al. | 361/737 |
| 6,097,605 A | * | 8/2000 | Klatt et al. | 361/737 |
| 6,173,405 B1 | * | 1/2001 | Nagel | 713/200 |
| 6,343,945 B1 | * | 2/2002 | Liikanen | 439/160 |
| 6,494,745 B1 | * | 12/2002 | Schremmer | 439/630 |
| 6,518,927 B2 | * | 2/2003 | Schremmer et al. | 343/702 |
| 6,592,031 B1 | * | 7/2003 | Klatt | 235/382 |
| 6,612,492 B1 | * | 9/2003 | Yen | 235/451 |

FOREIGN PATENT DOCUMENTS

FR              1291804 A1  *  3/2003  ............ G06K/7/00

* cited by examiner

Primary Examiner—Michael Datskovsky

(57) ABSTRACT

A network card device includes a housing having an interface coupler for coupling to computer facilities, a circuit board received in the housing, a cassette having a base received in the housing, and a cap pivotally secured to the base with a pivot axle, for allowing the cap to be opened relative to the base, and for allowing a card member to be engaged into the cassette. A cover is secured to the housing, for enclosing the chamber of the housing, and includes a space, and a lid pivotally secured to the cover, for enclosing the space of the cover. The card member may be engaged into the cassette, and protected by the cover and the housing.

3 Claims, 7 Drawing Sheets

NETWORK CARD DEVICE HAVING PROTECTIVE STRUCTURE

BACKGROUND OF THE INVENTION

1. Field of the Invention

The present invention relates to a network card device, and more particularly to a network card device having a protective structure to protect the card members that are engaged into the network card device.

2. Description of the Prior Art

Typical network card devices are provided for coupling to computer facilities, and may comprise a side portion for plugging various card members.

However, the card members will be extended outwardly of the typical network card device, and thus may not be suitably protected, and may be hit relative to the typical network card device, and may thus be easily damaged after use.

The present invention has arisen to mitigate and/or obviate the afore-described disadvantages of the conventional network card devices.

SUMMARY OF THE INVENTION

The primary objective of the present invention is to provide a network card device including a protective structure to protect the card members that are engaged into the network card device, in order to prevent the card members from being hit or damaged inadvertently.

In accordance with one aspect of the invention, there is provided a network card device for coupling to computer facilities, the network card device comprising a housing including a first end having an interface coupler provided thereon, and including a chamber formed therein, and a circuit board received in the chamber of the housing, a cassette including a base received in the housing, and a cap pivotally secured to the base with a pivot axle, for allowing the cap to be opened relative to the base, and for allowing a card member to be engaged into the cassette, a cover secured to the housing, for enclosing the chamber of the housing, and including a space formed therein, and a lid pivotally secured to the cover, for enclosing the space of the cover. The lid may be opened relative to the cover, and the cap is openable relative to the base via the space of the cover, for allowing the card member to be engaged into the cassette, and in order to prevent the card members from being hit or damaged inadvertently.

The housing includes an opening formed therein and communicating with the chamber thereof, the circuit board includes a coupler provided thereon and aligned with the opening of the housing, for coupling to such as the earpieces.

The lid includes a first end having at least one pin extended therefrom and rotatably engaged in the cover, and includes a second end having a latch provided thereon for openably locking the lid to the cover. The cover may include one or more notches formed therein to rotatably receive the pins of the lid, and thus for allowing the lid to be rotatably attached to the cover.

Further objectives and advantages of the present invention will become apparent from a careful reading of the detailed description provided hereinbelow, with appropriate reference to the accompanying drawings.

DETAILED DESCRIPTION OF THE PREFERRED EMBODIMENT

Figure 7:
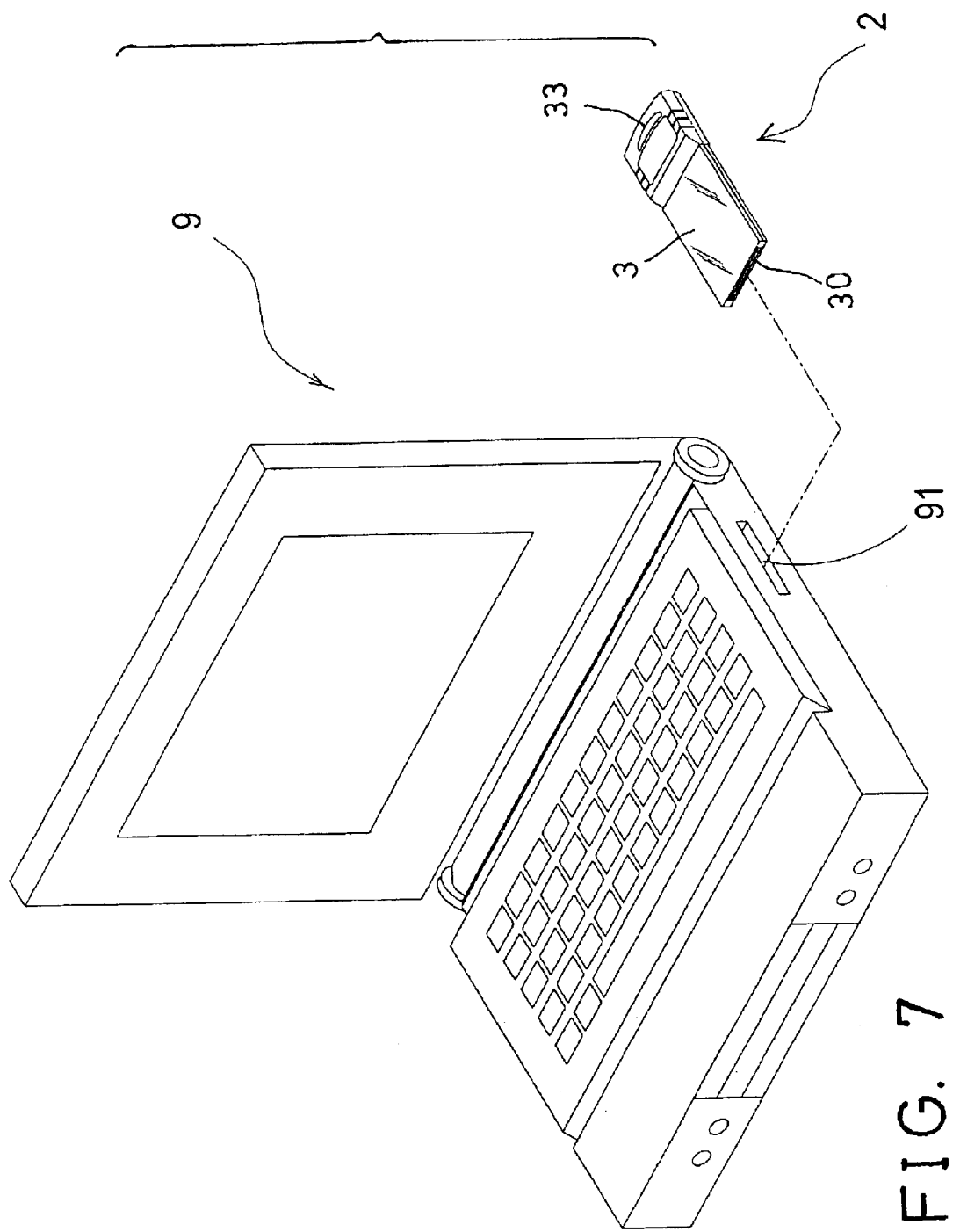
FIG. 7 is an exploded view illustrating the attachment of the network card device to a computer facility.

Referring to the drawings, and initially to FIGS. 1–6, a network card device 2 in accordance with the present invention comprises a housing 3 including an interface coupler 30, such as a personal computer card international association (PCMCIA) interface coupler 30 provided on one end thereof, for plugging into the socket 91 of various computer facilities, such as the portable or notebook computer 9 as shown in FIG. 7.

The housing 3 includes a chamber 31 formed therein, and an opening 32 formed in the other end thereof, and communicating with the chamber 31 thereof. A circuit board 4 may be received in the chamber 31 of the housing 3, and may include a socket or another coupler 41 disposed thereon and aligned with the opening 32 of the housing 3. The coupler 41 may be a coupler for attaching or coupling to such as earpieces (not shown).

A cassette 5 may also be received in the chamber 31 of the housing 3, and may include a base 51 secured in the housing 3, and a cap 52 pivotally secured to the base 51 with pivot axles 53, for allowing the cap 52 to be opened relative to the base 51 (FIGS. 5, 6), and for allowing various card members 6 (FIG. 6) to be engaged into cassette 5 of the network card device 2.

A cover 7 may be detachably secured onto the housing 3 with such as fasteners (not shown), for enclosing the chamber 31 of the housing 3, and includes a space 71 formed therein, and one or more notches 710, 711 formed therein. A lid 8 includes one or more pins 81, 82 extended from one end thereof and rotatably engaged in the respective notches 710, 711 of the cover 7, for detachably or openably securing the lid 8 to the cover 7. The lid 8 may include a latch 83 provided on the other end thereof for openably locking the lid 8 to the cover 7.

Figure 1:
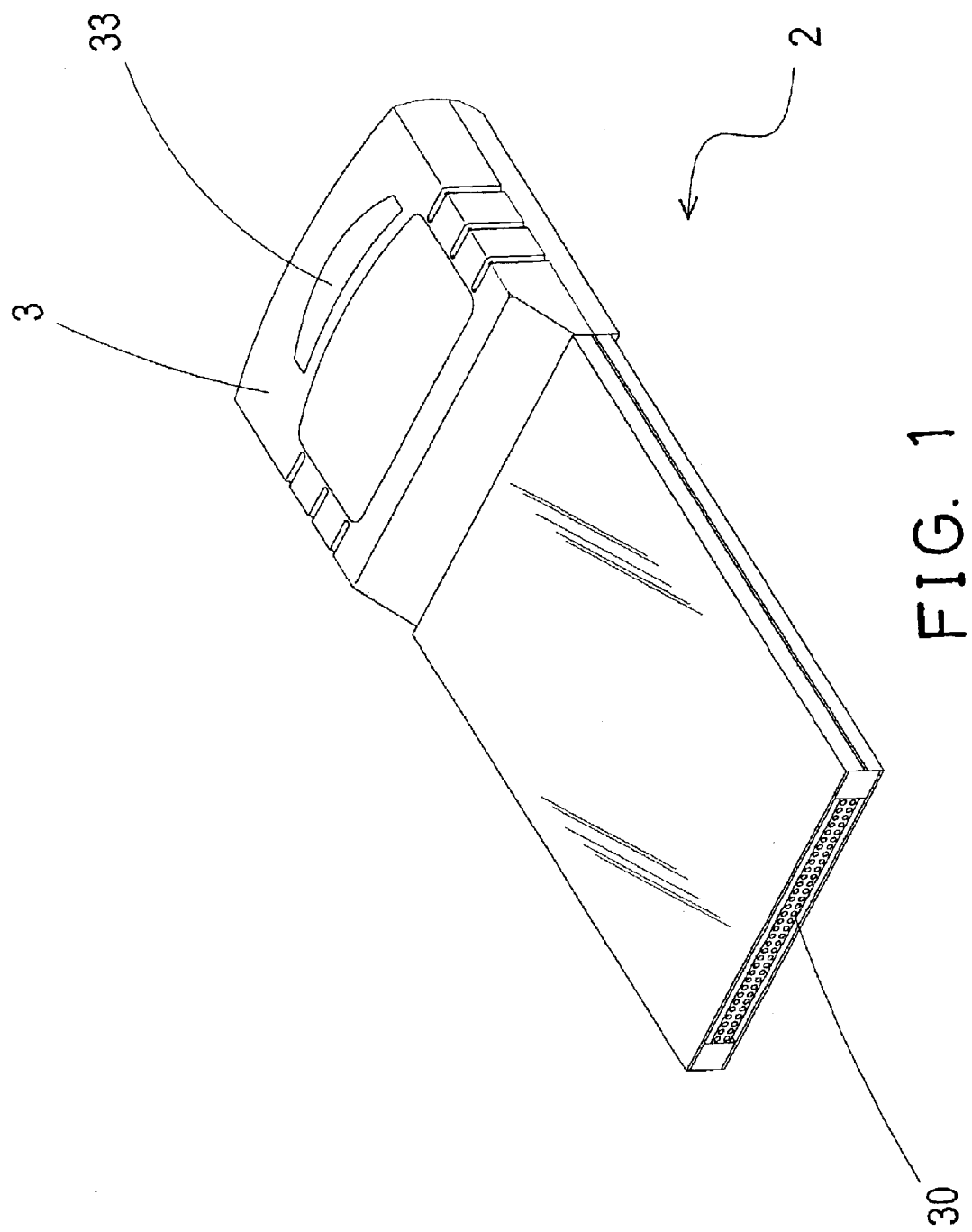
FIG. 1 is an upper perspective view of a network card device in accordance with the present invention.
Figure 2:
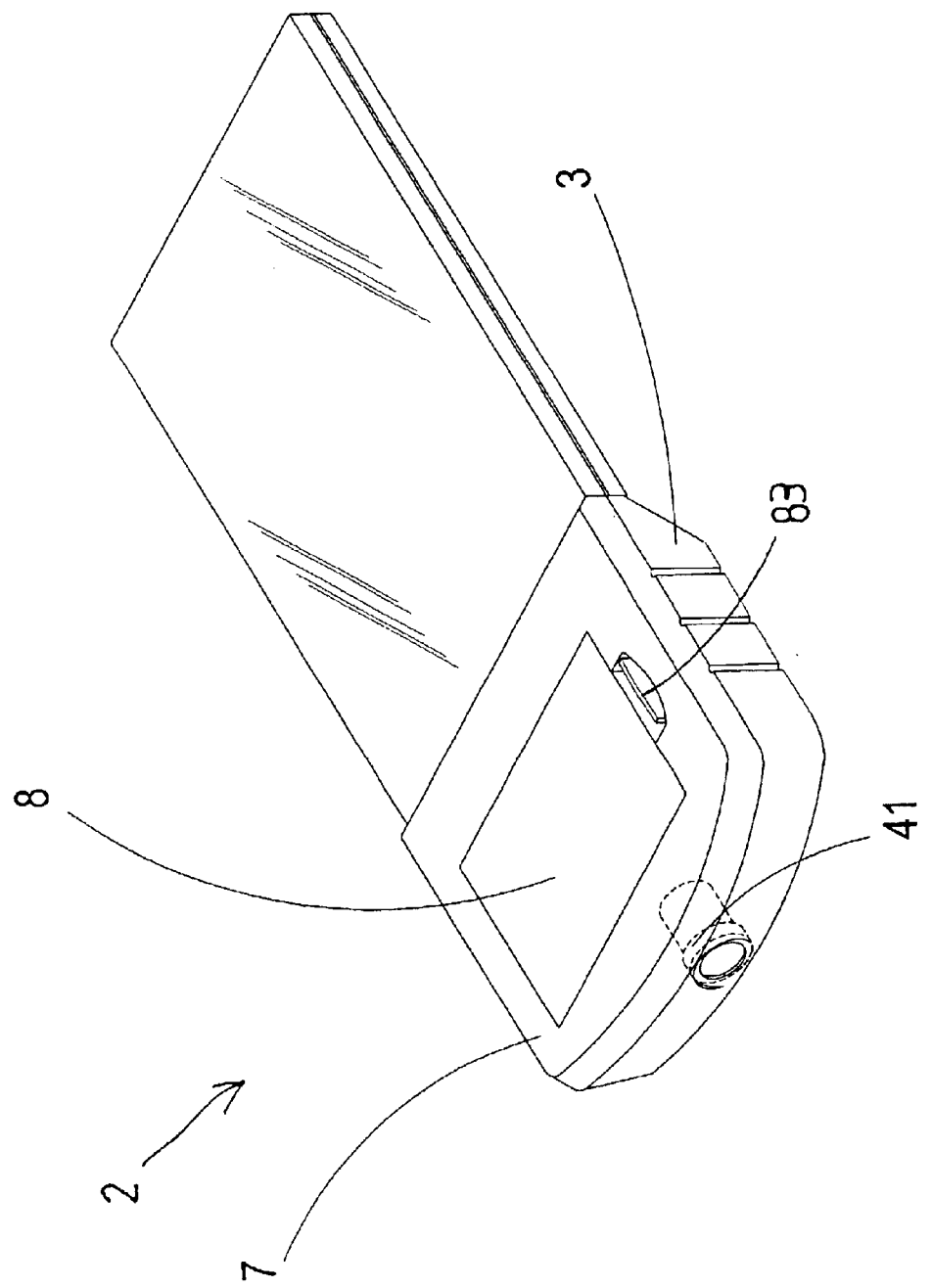
FIG. 2 is a bottom perspective view of the network card device.
Figure 3:
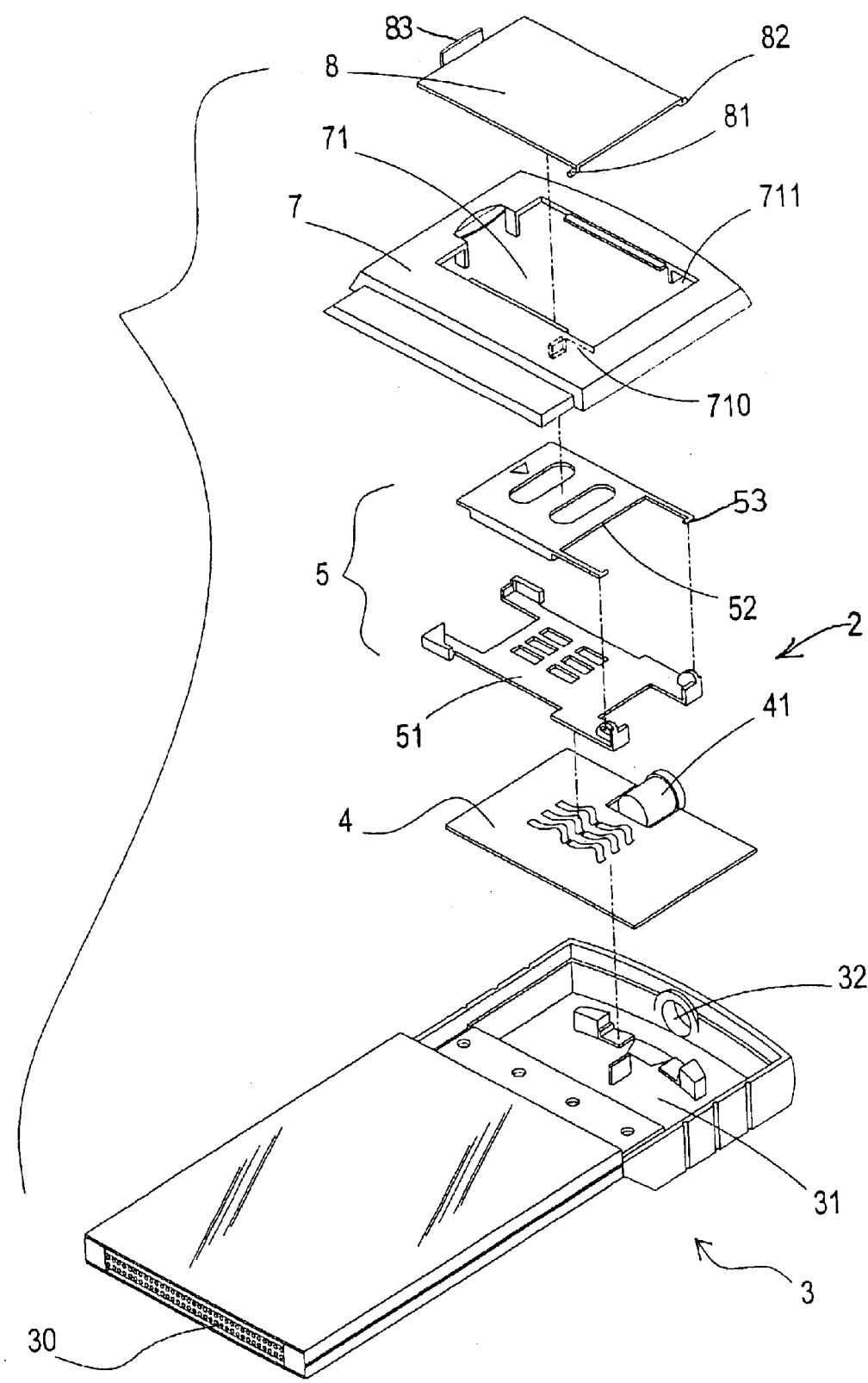
FIG. 3 is a partial exploded view of the network card device.
Figure 4:
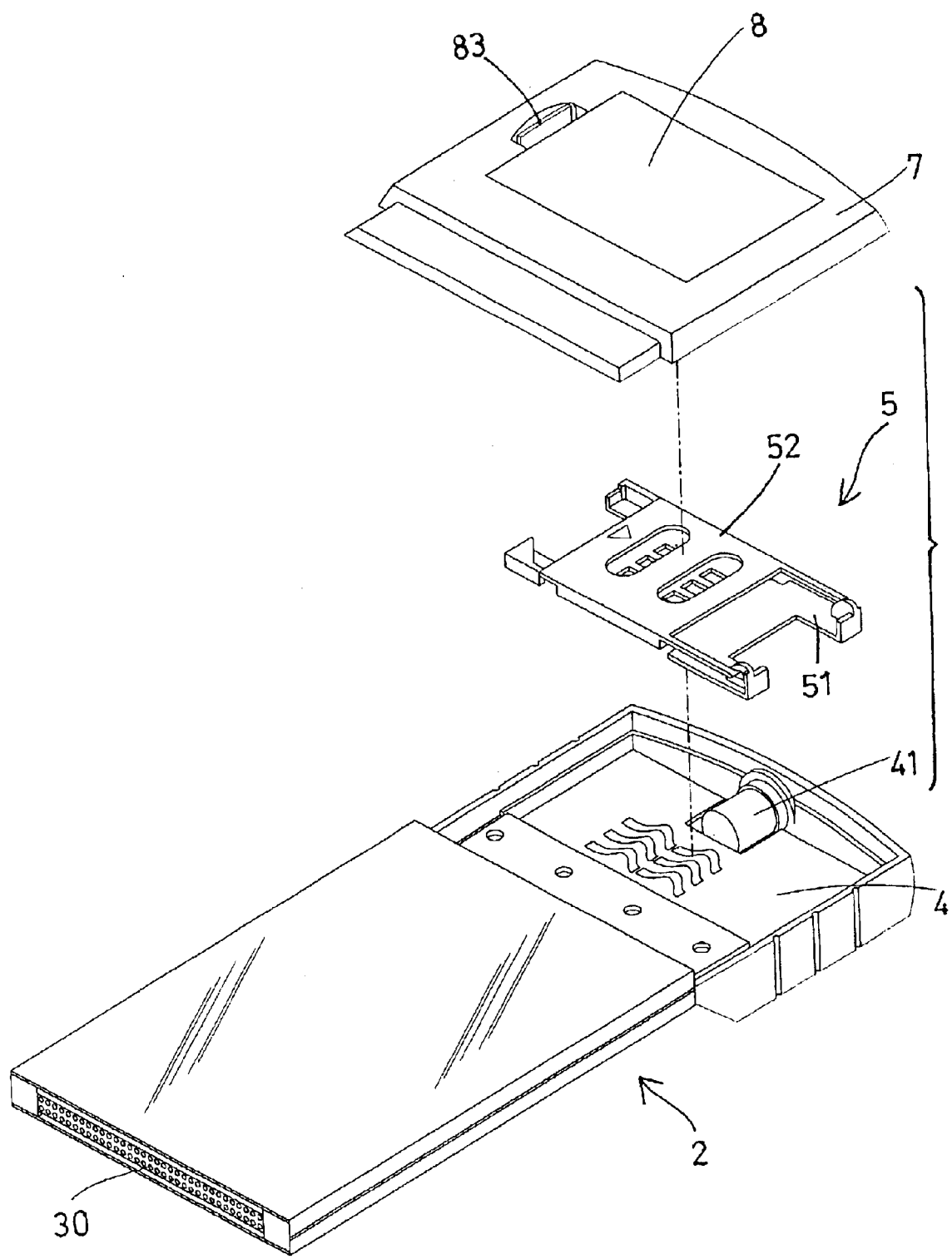
FIG. 4 is another partial exploded view of the network card device.
Figure 5:
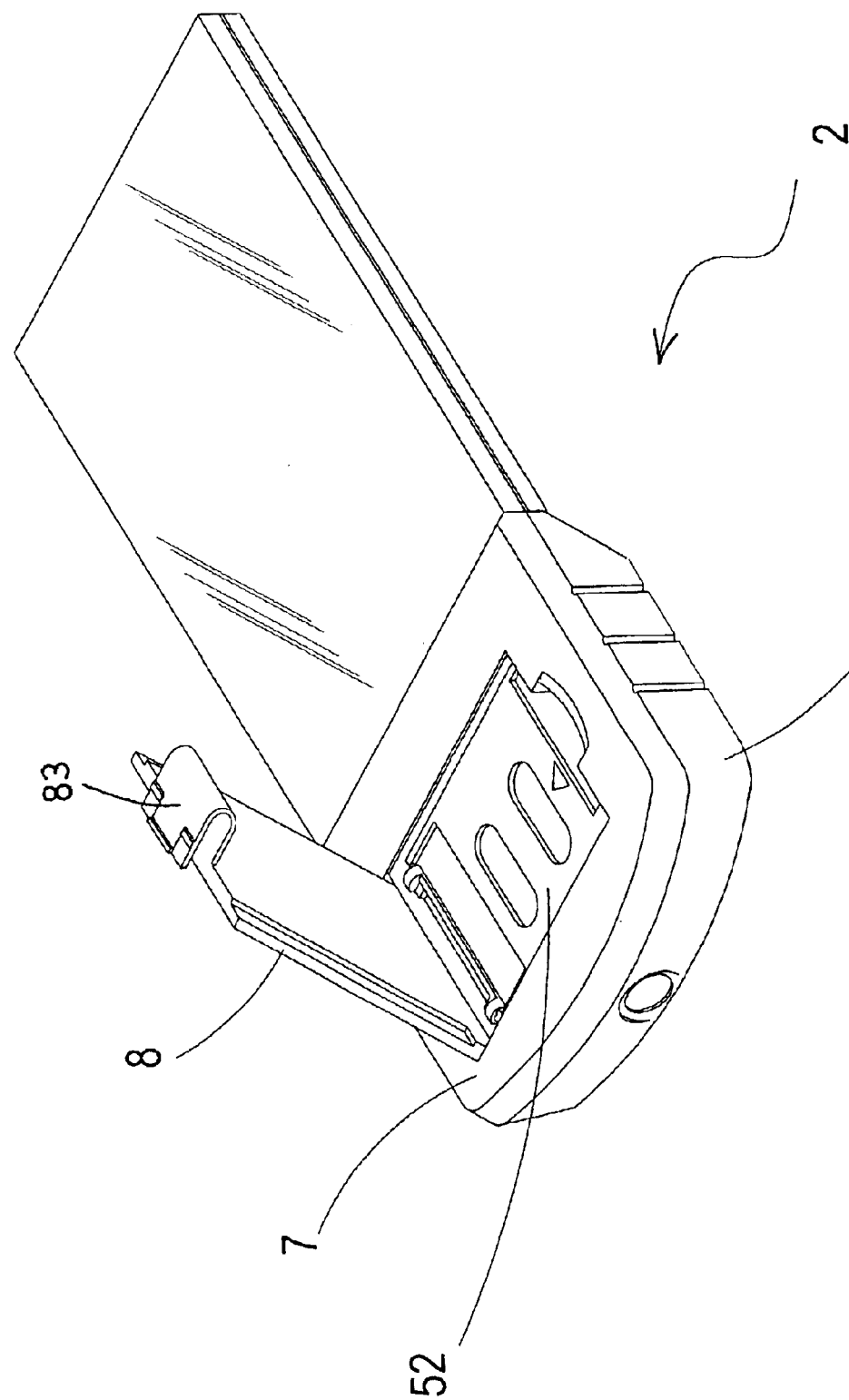
FIGS. 5, 6 are bottom perspective views illustrating the operation of the network card device.
Figure 6:
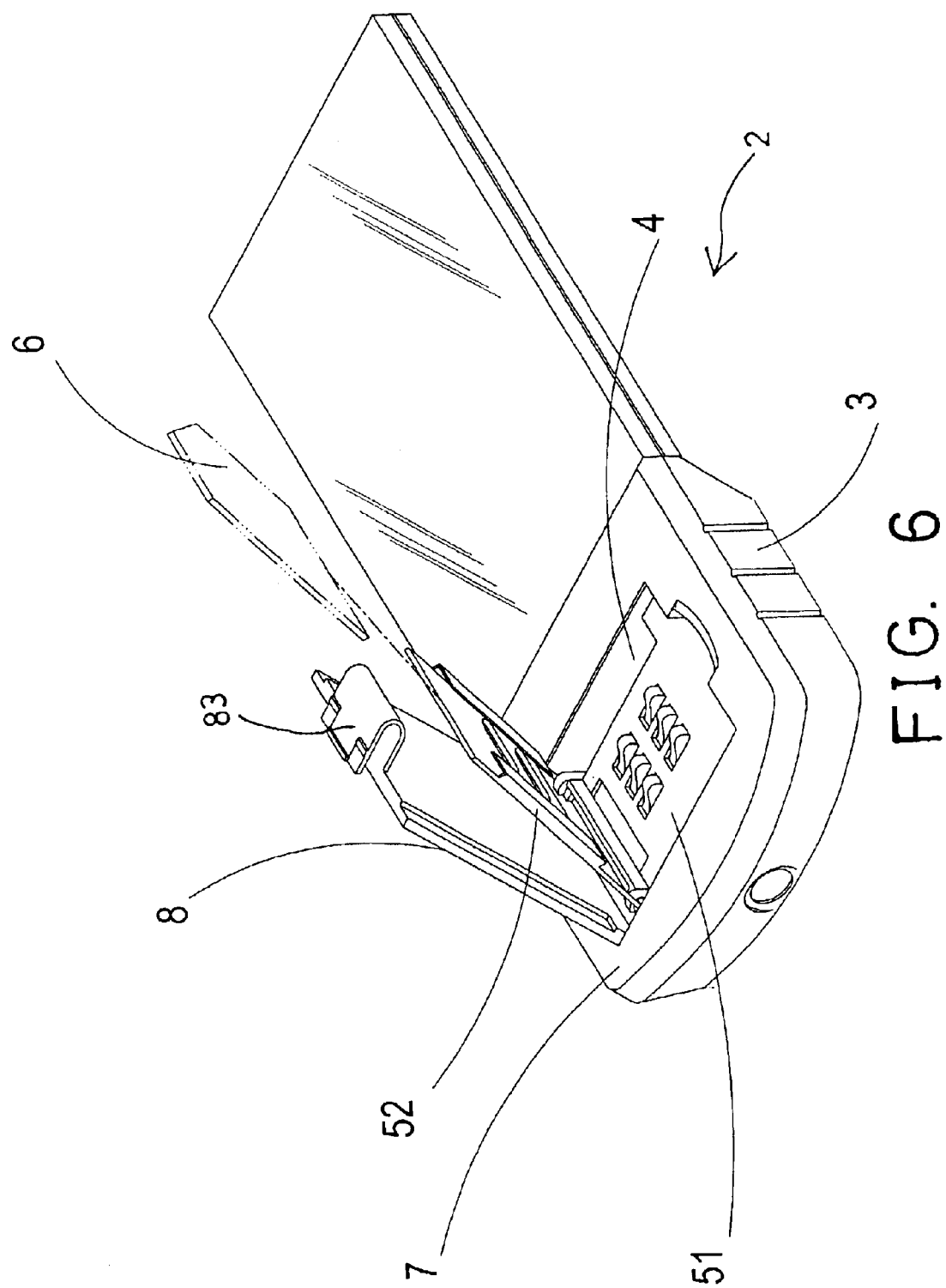

In operation, the lid 8 may be opened relative to the housing 3, as shown in FIG. 5, and the cap 52 may then be opened relative to the base 51 (FIG. 6), for allowing various card members 6 to be engaged into the cassette 5 of the network card device 2. The network card device 2 may then be plugged into the socket 91 of various computer facilities, such as the portable or notebook computer 9 as shown in FIG. 7.

The card members 6 may thus be protected within the cassette 5, and thus will not be damaged inadvertently. The housing 3 may include a screen or a display 33 provided on the front portion thereof (FIGS. 1, 7), to show or indicate the operation of the network card device 2.

Accordingly, the network card device in accordance with the present invention includes a protective structure to protect the card members that are engaged into the network card device.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A network card device for coupling to computer facilities, said network card device comprising:
   a housing including a first end having an interface coupler provided thereon, and including a chamber formed therein, and
   a circuit board received in said chamber of said housing,
   a cassette including a base received in said housing, and a cap pivotally secured to said base with a pivot axle, for allowing said cap to be opened relative to said base, and for allowing a card member to be engaged into said cassette,
   a cover secured to said housing, for enclosing said chamber of said housing, and including a space formed therein, and
   a lid pivotally secured to said cover, for enclosing said space of said cover,
      said lid being openable relative to said cover, and said cap being openable relative to said base via said space of said cover, for allowing the card member to be engaged into said cassette.

2. The network card device as claimed in claim 1, wherein said housing includes an opening formed therein and communicating with said chamber thereof, said circuit board includes a coupler provided thereon and aligned with said opening of said housing.

3. The network card device as claimed in claim 1, wherein said lid includes a first end having at least one pin extended therefrom and rotatably engaged in said cover, and includes a second end having a latch provided thereon for openably locking said lid to said cover.

* * * * *